United States Patent
Popescu

(10) Patent No.: US 9,810,753 B2
(45) Date of Patent: Nov. 7, 2017

(54) WIRELESS SIGNAL TRANSMISSION IN MAGNETIC RESONANCE SYSTEMS

(71) Applicant: Stefan Popescu, Erlangen (DE)

(72) Inventor: Stefan Popescu, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 533 days.

(21) Appl. No.: 14/487,282

(22) Filed: Sep. 16, 2014

(65) Prior Publication Data

US 2015/0084636 A1   Mar. 26, 2015

(30) Foreign Application Priority Data

Sep. 24, 2013  (DE) .................. 10 2013 219 128

(51) Int. Cl.

| | | |
|---|---|---|
| *G01R 33/36* | (2006.01) | |
| *G01R 33/34* | (2006.01) | |
| *H04B 1/04* | (2006.01) | |
| *G01R 33/3415* | (2006.01) | |

(52) U.S. Cl.
CPC .......... *G01R 33/3692* (2013.01); *G01R 33/34* (2013.01); *H04B 1/0483* (2013.01); *G01R 33/3415* (2013.01)

(58) Field of Classification Search
CPC  G01R 33/3692; G01R 33/34; G01R 33/3415; H04B 1/0483
See application file for complete search history.

(56) References Cited

U.S. PATENT DOCUMENTS

| | | | |
|---|---|---|---|
| 6,791,322 B2 | 9/2004 | Vester | |
| 2010/0265138 A1* | 10/2010 | Biem | G01S 3/74 342/442 |
| 2012/0056620 A1* | 3/2012 | Feinberg | G01R 33/4835 324/309 |
| 2013/0063281 A1* | 3/2013 | Malaska | G08G 1/096783 340/905 |
| 2013/0106905 A1* | 5/2013 | Sunaga | A61B 5/055 345/619 |
| 2013/0200899 A1* | 8/2013 | Yi | H04L 27/00 324/322 |
| 2013/0295867 A1* | 11/2013 | Harris, III | H04B 7/0814 455/277.1 |

FOREIGN PATENT DOCUMENTS

DE        10148462 C1     6/2003

* cited by examiner

*Primary Examiner* — Rodney Bonnette
(74) *Attorney, Agent, or Firm* — Lempia Summerfield Katz LLC

(57) ABSTRACT

A method is described for the wireless signal transmission of a measurement signal and/or a control signal between two functional components of a MR system. The measurement signal and/or the control signal is encoded into a RF transmit signal with a predefined orbital angular momentum and this RF transmit signal is transmitted between transmit antenna arrangements of the functional components. In addition, the embodiments relate to a local coil and an orbital angular momentum transmit unit with which the method may be carried out, and also a MR system that has a local coil and an orbital angular momentum transmit unit of this type.

18 Claims, 7 Drawing Sheets

WIRELESS SIGNAL TRANSMISSION IN MAGNETIC RESONANCE SYSTEMS

CROSS-REFERENCE TO RELATED APPLICATIONS

This application claims the benefit of DE 10 2013 219 128.6, filed on Sep. 24, 2013, which is hereby incorporated by reference in its entirety.

TECHNICAL FIELD

The embodiments relate to methods for wireless signal transmission of a measurement signal and/or control signal between two functional components of a MR (magnetic resonance) system, which in each case have a transmit antenna arrangement. In addition, the embodiments relate to a local coil with a MR antenna element array for receiving and/or transmitting a MR signal. Furthermore, the embodiments relate to an orbital angular momentum transmit unit designed to receive and/or transmit RF transmit signals. Furthermore, the embodiments relate to a MR system including such a local coil and/or an orbital angular momentum transmit unit.

BACKGROUND

Today, medical technology imaging systems play an important role in the examination of patients. The representations of the internal organs and structures of the patient generated by the imaging systems are used to diagnose causes of disease, to plan operations, in the performance of operations, and to prepare therapeutic measures. Examples of such imaging systems are ultrasound systems, x-ray computer tomography (CT) systems, positron emission tomography (PET) systems, single-photon emission tomography (SPECT) systems, or magnetic resonance systems.

In a magnetic resonance system, the object under examination is exposed to the most uniform possible, static basic magnetic field (e.g., referred to as the $B_0$ field). As a result, the macroscopic magnetization in the body is aligned parallel to the direction of the $B_0$ field. Moreover, radio frequency pulses (also referred to as the $B_1$ field) are radiated with radio frequency transmit antennas into the object under examination, their frequency being in the range of the resonant frequency, known as the Larmor frequency, of the nuclei to be excited (e.g., hydrogen nuclei) in the magnetic field. By these radio frequency pulses, the macroscopic magnetization in the object under examination is excited in such a way that the macroscopic magnetization is deflected through a "flip angle" from its equilibrium position parallel to the basic magnetic field $B_0$. The macroscopic magnetization precesses initially around the z-direction and gradually relaxes once more. The magnetic resonance measurement signals (MR signals) generated in this relaxation of the nuclear magnetization are captured as so-called raw data by radio frequency receive antennas. The magnetic resonance images of the object under examination are reconstructed on the basis of the acquired raw data, where a spatial encoding is carried out using fast-switched gradient (e.g., magnetic) fields that are superposed on the basic magnetic field during the transmission of the magnetic resonance radio frequency pulses and/or the acquisition of the raw data.

Today, local coils are normally used as coils for receiving the MR signals of the object under examination. These local coils are MR antenna element arrays that include one or more MR antenna elements, e.g., in the form of conductor loops. These local loops are disposed during the examination relatively close to the body surface, as directly as possible on the organ or body part of the patient to be examined. In contrast to larger antennas more distant from the patient, the local coils offer the advantage that the local coils are disposed closer to the areas of interest. The noise components caused by the electrical losses in the antennas themselves and within the body of the patient are thereby reduced, as a result of which the signal-to-noise ratio of a local coil is in principle better than that of a more distant antenna.

The MR signals received by the MR antenna elements are normally also preamplified in the local coil and guided out of the central area of the magnetic resonance system via cables and fed to a shielded receiver of a MR signal processing device. The received data is then digitized in the latter and further processed for the imaging. An increasing number of MR antenna elements within a local coil or an increasing number of local coils during an examination consequently results in an increased requirement for cables for transmitting the MR signals. However, a multiplicity of cables slows down the attachment of the local coils to the object under examination, resulting in longer treatment times and therefore higher treatment costs. In addition, it is assumed that a multiplicity of the patients perceive a large number of cables as intrusive. Moreover, the investigation space within a MR system is limited, which limits the use of a multiplicity of cables, e.g., if the patient is moved on an associated bed facility. The aforementioned restrictions apply particularly if analog response signals are transmitted by the MR antenna elements, since shielded (e.g., coaxial) cables may have a large cross section and a high weight and are expensive.

In DE 101 48 462 C1, a device is described with which the MR signals of a plurality of MR antenna elements are transmitted wirelessly. However, the wireless transmission has the disadvantage that a high bandwidth is required with the data volume to be transmitted and a multiplicity of transmit channels that are intended to be operated in parallel. On the other hand, the available free bandwidth is small, since a multiplicity of electromagnetic signals already occurs in the range of MR systems. With increasing bandwidth, the measures required to avoid disturbances, in particular electrical interference, over a very wide frequency range incur considerable cost.

SUMMARY AND DESCRIPTION

The scope of the present invention is defined solely by the appended claims and is not affected to any degree by the statements within this summary. The present embodiments may obviate one or more of the drawbacks or limitations in the related art.

One object is to indicate an improved method and a device for the wireless transmission of a measurement signal and/or a control signal between two functional components, in particular between a local coil and a local coil interface on the device side, of a MR system, that may reduce the aforementioned problems.

In a method for the wireless transmission of a measurement signal, (e.g., a MR signal from a local coil, and/or a control signal between two functional components of a MR system), the measurement signal and/or control signal to be transmitted is encoded into a RF transmit signal with a predefined orbital angular momentum. This RF transmit signal is transmitted between transmit antenna arrangements of the functional components designed for this purpose. The method may be applied not only to signals transmitted by the first functional component and received by the second functional component, but also to signals transmitted by the second functional component and received by the first functional component.

Functional components may be understood here to refer to two components of a MR system that serve to perform defined MR-specific functions within the MR system. For example, one functional component may be a local coil and the other a local coil interface on the device side, e.g., permanently installed in the control device of the MR system or connected to the latter. A local coil interface of this type may include a receive device, (e.g., the MR signal processing device), to receive and further process the MR signals or raw data measured and transmitted by the local coil. Additionally or alternatively, the local coil interface may also include a transmit device for controlling the local coil, in particular, if the local coil is a local call with which the radio frequency signals (also) may be transmitted in order to excite the nuclear spin. Furthermore, one functional component may be a type of optional "additional component," such as, for example, a pulse measurement device and/or an ECG measurement device in order, for example, to record additional information on the object under examination, correlated with the magnetic resonance images. In this case, the second functional component may be an interface that receives the signals for further processing or transmits control signals to these functional components.

Measurement signals are signals that are measured or acquired by a functional component, e.g., the MR signals measured by a local coil, but, for example, also signals measured by a pulse measurement device or an ECG measurement device.

Control signals, on the other hand, are signals that serve to control a functional component. For example, control signals may be transmitted from the MR signal processing device to the local coil in order to activate or deactivate the local coil or individual conductor loops. In particular, control signals may also include signals for a local coil in order to cause the latter in transmit mode to transmit a RF excitation signal, e.g., the control signals include all data that are required in order to transmit a defined pulse shape and/or pulse sequence.

The orbital angular momentum of a transmitted signal is a physical property of electromagnetic radiation. Electromagnetic signals with a non-zero orbital angular momentum have a helical shape, where the wave itself is forced onto a helix, unlike in the case of circular-polarized waves, in which the wave per se continues to run straight ahead and only the polarization plane rotates. The helix runs around a virtually imagined propagation axis A that extends in the direction of propagation of the wave. The pitch of the helix increases with higher orbital angular momentum values. FIG. 1 depicts, in the right-hand part of the illustration, for better understanding, a RF transmit signal with orbital angular momentum I=1 (depicted schematically by a helical wave). It is evident here that, directly on the central line or propagation axis A of the wave, in contrast to the case of a circular-polarized wave, the energy density decreases sharply with decreasing distance to the axis.

Through the encoding of the measurement signal and the control signal into a RF transmit signal with a predefined (e.g., previously selected, defined) orbital angular momentum, the RF transmit signal is provided with an additional property rendering it distinguishable from other RF signals in the same frequency range. The risk of interference is thus reduced. Signal transmissions using the orbital angular momentum thus also offer the possibility of making available a further multiplicity of further channel capacities along with the polarization. This increase in the channel capacity takes place without increasing the frequency range, so that, as will be subsequently explained, the data volume transmitted with a specific bandwidth may also be increased.

A local coil that has a conventional MR antenna element array for receiving and/or transmitting a MR signal includes an orbital angular momentum transmit unit with a local coil transmit antenna arrangement that is designed to transmit and/or receive a RF transmit signal having an orbital angular momentum. The orbital angular momentum transmit unit furthermore includes an orbital angular momentum encoding unit.

This orbital angular momentum encoding unit is designed to encode measurement signals, in particular, MR signals acquired by the MR antenna element array and/or control signals onto a RF transmit signal, and/or decode them from a RF transmit signal. It is noted at this juncture that, the term "orbital angular momentum encoding unit" has been chosen regardless of whether it has an encoder function, a decoder function, or both functions in respect of the RF transmit signals to be encoded or decoded.

An orbital angular momentum transmit unit accordingly includes a transmit antenna arrangement to receive and/or transmit a RF transmit signal. The transmit antenna arrangement, just as the local coil transmit antenna arrangement, may have turnstile antennas and/or tripole antennas. Furthermore, as mentioned above, the orbital angular momentum transmit unit includes an orbital angular momentum encoding unit for encoding and/or decoding a RF transmit signal, (e.g., using a Fourier transform).

An orbital angular momentum transmit unit of this type may form part of a local coil or any other functional component in order to equip the latter. In particular, existing functional components may thus also be retrofitted. For example, a local coil interface on the system side may be retrofitted, such as, for example, a receive device and/or a transmit device conventionally connected via cables to the local coils.

A MR system has a local coil and/or an orbital angular momentum transmit unit in the design specified above.

As mentioned, one of the functional components may include a local coil, and the second of the functional components a local coil interface on the device side of a MR system. The measurement signal may include a MR signal that is received by the MR antenna element array. In the local coil, a MR signal may be encoded onto a RF transmit signal provided with an orbital angular momentum. As mentioned, the orbital angular momentum encoding of the RF transmit signal offers the advantage that a unique allocation of the transmit channel is possible via the orbital angular momentum, by which the RF transmit signal of the local coil is rendered (additionally) distinguishable from other RF signals in the MR system and/or external RF signals.

RF transmit signals with different orbital angular momenta may be encoded in a multiplex method into a "mixed" RF transmit signal, (e.g., into a signal including a plurality of superposed orbital angular momenta), which may all be transmitted at the same frequency and at the same time. This offers the advantage that considerably more information may be transmitted, even without widening the frequency band.

The RF transmit signal may lie in a frequency range above 1 GHz, (e.g., in a frequency range around 2 GHz), where the frequency band may have a bandwidth of ±15 MHz. The advantage of this frequency range is that disturbances in the form of interference with the other fields present in the MR system are substantially reduced and, in the ideal case, may be excluded, since the frequencies of the pulsed magnetic field gradients in the MR system lie in the kilohertz range and the magnetic resonance frequencies lie in the megahertz range.

According to one embodiment, the orbital angular momentum is impressed onto the RF transmit signal by a spiral phase plate, wherein a spiral phase plate (also referred to below as "phase plate" for short) is understood to refer to a plate of which the thickness increases constantly coiled around a (e.g., virtual) helical axis, e.g., helically or azimuthally. The plate may be circular. If, for example, an incoming electromagnetic wave runs along the helical axis through this phase plate, an orbital angular momentum is impressed onto it. The orbital angular momentum to be encoded may be set through a corresponding selection of the pitch of the phase plate. The phase plate may include metal oxide with a high dielectric constant $\in_r$, (e.g., aluminum oxide and titanium dioxide). The material of the phase plate and its maximum thickness (e.g., the thickness at the strongest point of the phase plate) may be selected depending on the required carrier frequency. The transmit antenna arrangement may correspondingly may have a number of antennas, (e.g., horn antennas), in each case with a phase plate of this type. If a plurality of antennas are present, these antennas may have different phase plates.

The RF transmit signal having an orbital angular momentum may be received and decoded by an antenna arrangement, (e.g., as a further variant of a transmit antenna array). In particular, a reception and decoding of a plurality of superposed RF transmit signals with different orbital angular momenta is thus possible. The antenna array may, for example, be constructed with turnstile antennas and/or tripole antennas.

For the decoding of RF transmit signals with different orbital angular momenta, field values, (e.g., the strength and direction of the electrical field present in each case at the relevant location at the respective time), may be measured at a specified time at different angular positions of the antenna array. A signal value of the individual RF transmit signals at the respective time may be calculated on the basis of these field values. A Fourier transform may be used for this purpose. If this measurement and calculation are carried out at a plurality of times, the received RF transmit signal or the RF transmit signals (or the amplitude characteristic of the individual RF transmit signals) may thus be determined over time. A more detailed explanation of the method will be given later with reference to the figures.

The individual antennas of the antenna array may in principle be disposed in any given manner, for example in a matrix-type grid. The antennas of the antenna array may be disposed in a polar coordinate grid. Since field values may be used at different angular positions of the antenna array for the above-mentioned determination of the RF transmit signal or RF transmit signals, the field values may be measured directly on the antennas of the antenna array. In one embodiment, the array includes only a circle or a spiral. It is important here that a sufficient number of different measurement values for different angles are present. However, it is also possible, on the basis of the field values measured directly on the antennas, to interpolate further field values at intermediate positions and use these in the calculations of the RF transmit signal or RF transmit signals.

As will similarly be explained in more detail later, a transmit antenna arrangement may also be used in the form of an antenna array to generate a RF transmit signal having an orbital angular momentum. Here, the individual antennas are controlled for the encoding in such a way that they generate previously calculated E-field values in a coordinated manner and the RF transmit signal having an orbital angular momentum is thus generated through superposition of the individual field values. A RF transmit signal with a defined orbital angular momentum may be generated here, but also a mixed RF transmit signal of the type occurring in the case of a multiplexing through superposition of a plurality of RF transmit signals with different orbital angular momenta.

DETAILED DESCRIPTION

Figure 1:
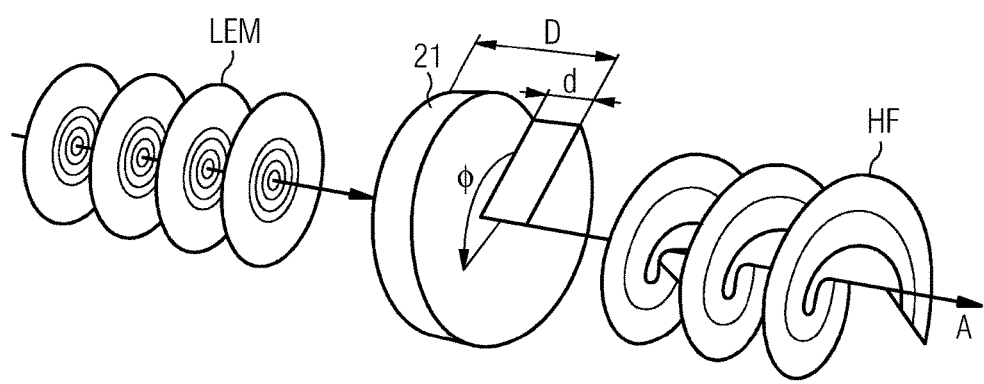
FIG. 1 depicts a schematic representation of an embodiment of a generation of an electromagnetic wave with orbital angular momentum l=1 through a phase plate.

FIG. 1 depicts an electromagnetic wave RF with an orbital angular momentum l=1 in the right-hand part of the illustration that propagates helically in the direction of a virtual propagation axis A. It is evident that the energy density decreases substantially in the center of the direction of propagation A. The number of helices of the wave is directly proportional to the orbital angular momentum I. As depicted in FIG. 1, the electromagnetic wave RF having an orbital angular momentum is generated, in particular, from a linear-polarized electromagnetic wave LEM arriving from the left. This wave runs through a circular phase plate 21 that, coiled around a coil axis at the azimuthal angle Φ, has an increasing thickness, where the thickness is in each case constant along a radius. The coil axis runs parallel to the direction of propagation. Depending on the frequency range in which the RF transmit signal is to be modulated, a suitable material and the suitable maximum density D (e.g., measured at the strongest point of the phase plate 21) may be selected in advance for the phase plate 21. The thickness is defined as $D=\lambda_m/4$, where $\lambda_m$ refers to the wavelength in the selected material according to:

$$\lambda_m = \frac{\lambda_0}{\sqrt{\mu_r \cdot \varepsilon_r}}. \qquad (1)$$

Here, $\lambda_0$ is the wavelength of the signal in air or in a vacuum (e.g., approx. 1 dm at 3 GHz), $\mu_r$ is the magnetic permeability (e.g., approx. 10) and $\in_r$ is the dielectric constant of the material of the phase plate 21. The phase plate 21 may include metal oxide with a high dielectric constant $\in_r$, (e.g., aluminum oxide with $\in_r=9$ or titanium dioxide with $E_r=100$).

The impressed orbital angular momentum may be defined through a selection of the pitch d (e.g., the maximum thickness difference following a rotation of the coil) of the phase plate 21.

Figure 2:
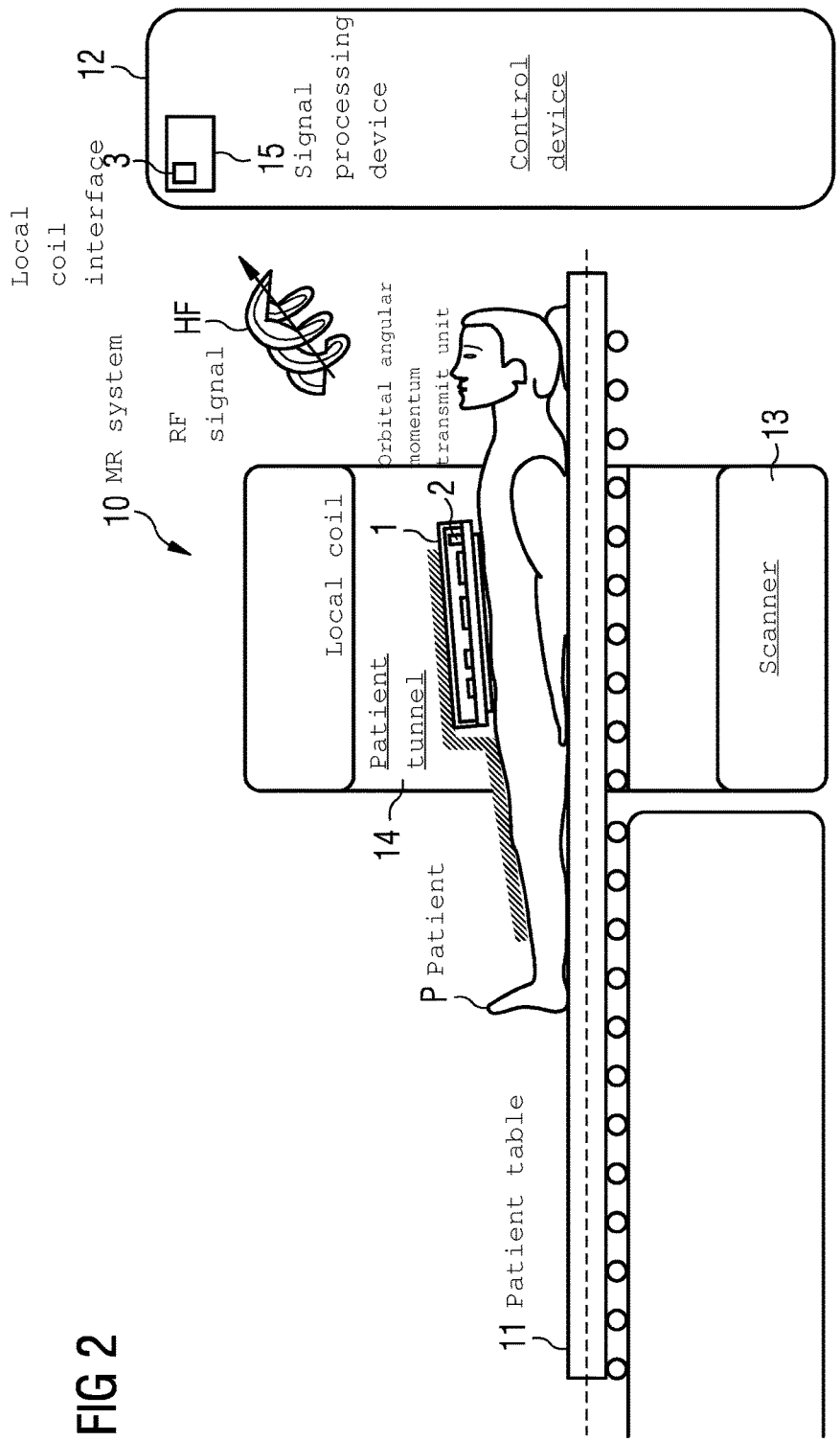
FIG. 2 depicts a schematic representation of an embodiment of a MR system.

FIG. 2 depicts an overview to explain the individual components of the MR system 10. Given that, due to the large data volumes, the system may be usable for transmitting MR signals (e.g., raw data) from a local coil 1 to a local coil interface 3 (e.g., as part of a MR signal processing device 12), it is assumed below, as an example, that the one functional component 1 is a local coil 1 and the other functional component is the local coil interface 3. However, this does not exclude the use of the embodiments on other functional components as well.

Here, the MR system 10 includes a patient table 11 with which a patient P may be introduced into a patient tunnel 14 of a scanner 13 of the MR system 10. A local coil 1 is located at an area of the patient P to be examined. In the operation of the MR system 10, the local coil 1 receives MR signals (e.g., raw data). In addition, the local coil 1 includes an orbital angular momentum transmit unit 2 that serves to encode the MR signals into a radio frequency signal HF (e.g., RF transmit signal) and transmit the radio frequency signal HF to a local coil interface 3. Here, the local coil interface 3 is designed as a component of a signal processing device 15 that is in turn a part of a control device 12 of the MR system 10. The RF transmit signal RF is received and decoded in the local coil interface 3 and the raw data are further processed in the signal processing device 15 or image data are reconstructed therefrom. The control device 12 and the scanner 13 of the MR system 10 may be constructed in a conventional manner and have all the components of a conventional MR system 10. In particular, the scanner 13 may have a basic magnetic field system, a gradient coil arrangement, an integrated whole-body coil to transmit RF pulses and/or to receive MR signals, etc.

Figure 3:
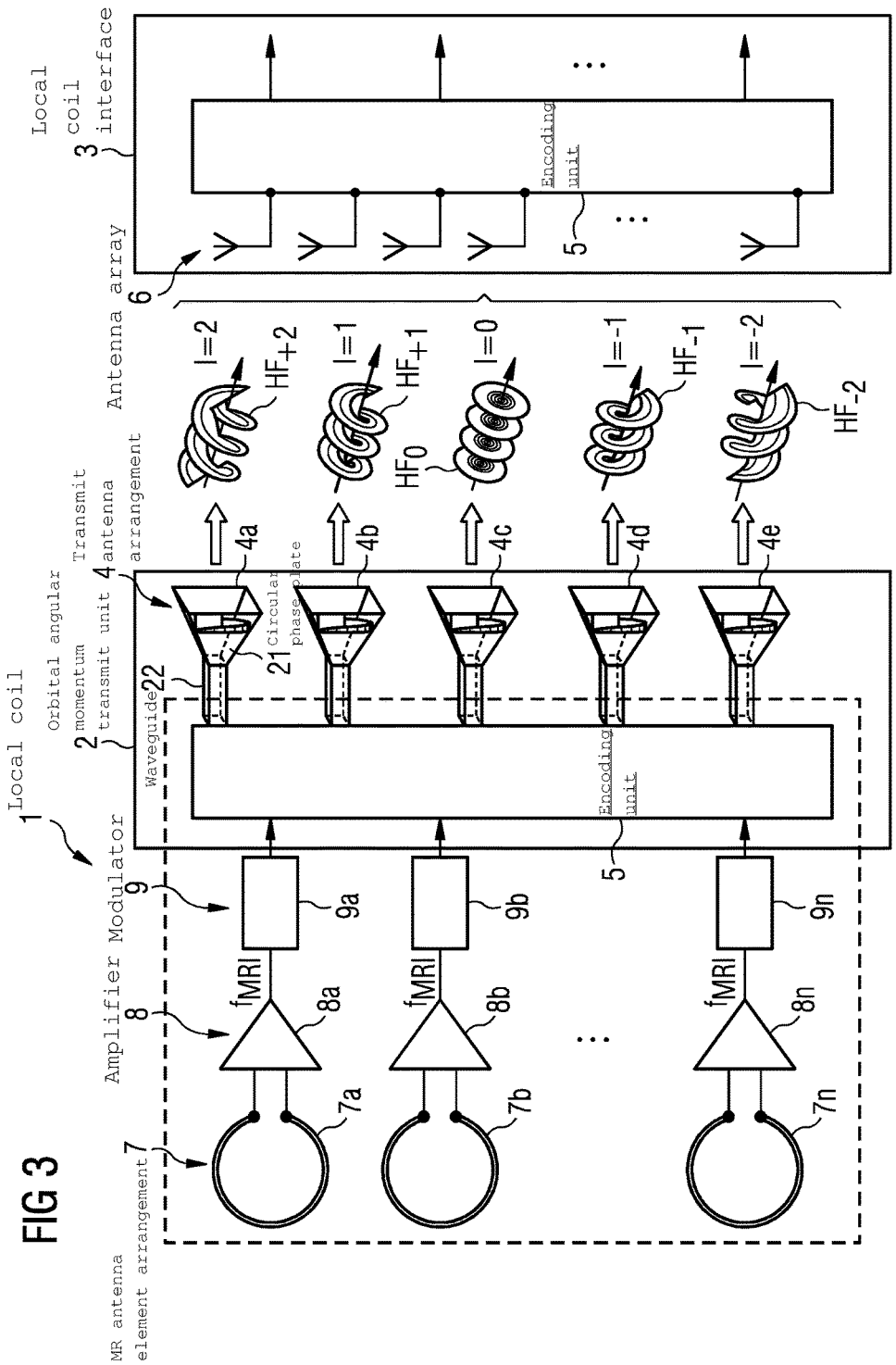
FIG. 3 depicts a schematic representation of a first embodiment of a local coil and a local coil interface.

FIG. 3 depicts a schematic representation of a first example embodiment of a local coil 1 and a local coil interface 3, of the type that may be used in the MR system 10 according to FIG. 2. This representation serves to explain the arrangement of the components involved in the signal transmission method. The local coil 1 includes a MR antenna element arrangement 7, an amplifier arrangement 8, a modulator arrangement 9, and the orbital angular momentum transmit unit 2 also depicted in FIG. 2.

Here, the antenna element arrangement 7 includes a plurality of antenna conductor loops 7a, 7b, . . . , 7n. A dedicated amplifier 8a, 8b, . . . , 8n of the amplifier arrangement 8 is assigned to each of the antenna conductor loops 7a, 7b, . . . , 7n, wherein the amplifiers 8a, 8b, . . . , 8n preamplify in a conventional manner the MR signals received by the antenna conductor loops 7a, 7b, . . . , 7n. Each of the amplifiers 8a, 8b, . . . , 8n is connected on the output side to a modulator 9a, 9b, . . . , 9n of the modulator arrangement 9.

Different embodiments are possible for the modulators 9a, 9b, . . . , 9n. On the one hand, this may involve analog modulators, which modulate the MR signal in a conventional manner, for example, through a frequency modulation, onto a carrier signal. Alternatively, digital modulators may also be used, in which the amplified MR signals are digitized in an ADC and encoded into the carrier signal. A RF signal with a frequency in the GHz range may be used as the carrier signal, (e.g., with a carrier frequency of 2 GHz), and the modulation bandwidth is ±15 MHz. The modulated carrier signal, (which includes the information of the MR signals and may be regarded as the measurement signal $f_{MRI}$ that includes the MR signal), is intended to be transmitted from the local coil 1 to the local coil interface 3.

Prior to the transmission, the measurement signal $f_{MRI}$ is further processed in the orbital angular momentum transmit unit 2. The orbital angular momentum transmit unit 2 includes an orbital angular momentum encoding unit 5 and a local coil transmit antenna arrangement 4. In the local coil 1 according to FIG. 3, the local coil transmit antenna arrangement 4 has a plurality of horn antennas 4a, 4b, 4c, 4d, 4e that are explained in more detail later, in each case with a phase plate 21.

The measurement signals $f_{MRI}$ supplied by the modulator arrangement 9 are encoded in the orbital angular momentum encoding unit 5 according to a predefined algorithm, for example, hardwired or programmed into the orbital angular momentum encoding unit 5.

The algorithm may provide a one-to-one assignment between an individual antenna conductor loop 7a, 7b, . . . , 7n of the MR antenna element arrangement 7 and an individual horn antenna 4a, 4b, 4c, 4d, 4e of the local coil transmit antenna arrangement 4. In certain embodiments, a more complex algorithm may also be used in the orbital angular momentum encoding unit 5. For example, the signals of a plurality of conductor coils of the MR antenna element arrangement 7 may be encoded onto a signal fed to an individual horn antenna 4a, 4b, 4c, 4d, 4e of the local coil transmit antenna arrangement 4 and may be transmitted by the latter. For example, modes may thus be formed in a known manner through combination of different MR signals, or a multiplexing may be achieved, (e.g., a time division multiplexing and/or a frequency division multiplexing), particularly if the modulators operate at different carrier frequencies.

Figure 4:
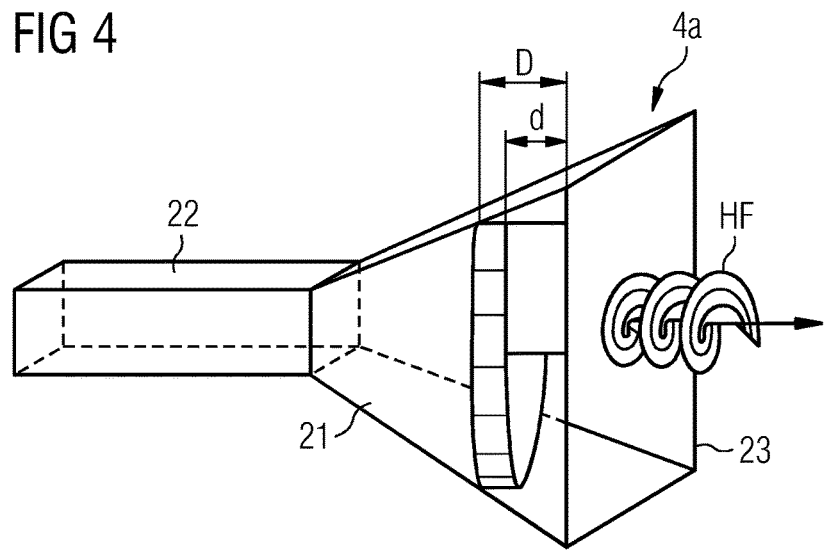
FIG. 4 depicts a detailed view of a horn antenna of the local coil according to FIG. 3.

Following the encoding of the RF signals in the orbital angular momentum encoding unit 5, the RF signals are transmitted using the horn antennas 4a, 4b, 4c, 4d, 4e of the local coil transmit antenna arrangement 4 in the form of RF transmit signals $HF_{-2}$, $HF_{-1}$, $HF_0$, $HF_{+1}$, $HF_{+2}$, which in each case have different orbital angular momenta. A detailed representation of a horn antenna 4a of the antenna arrangement 4 is depicted as an example in FIG. 4.

The horn antenna 4a has a waveguide 22 and a horn 23, so that a RF transmit signal incoming via the waveguide 22 is radiated by the horn 23. A phase plate 21, already explained above in connection with FIG. 1, which has a maximum thickness D and a pitch d, is disposed in the horn 23. RF signals fed via the waveguide 22 to the phase plate 21 are provided by the phase plate 21 with an orbital angular momentum, so that a RF transmit signal having an orbital angular momentum is transmitted via the horn 23 of the horn antenna 4a, as depicted in FIG. 1.

The use of phase plates 21 with different pitches d in the different horn antennas 4a, 4b, 4c, 4d, 4e offers the possibility of using a plurality of transmit channels at the same frequency of the RF transmit signal, where an orbital angular momentum is uniquely allocated to each of the transmit channels. For example, the horn antenna 4a may transmit a RF transmit signal $HF_{+2}$ having an orbital angular momentum l=2, the horn antenna 4b may transmit a RF transmit signal $HF_{+1}$ having an orbital angular momentum l=1, the horn antenna 4c may transmit a RF transmit signal $HF_0$ having an orbital angular momentum l=0, the horn antenna 4d may transmit a RF transmit signal $HF_{-1}$ having an orbital angular momentum l=−1 and the horn antenna 4e may transmit a RF transmit signal $HF_{-2}$ having an orbital angular momentum l=−2.

The RF transmit signals $HF_{-2}$, $HF_{-1}$, $HF_0$, $HF_{+1}$, $HF_{+2}$ transmitted in parallel by the horn antennas 4a, 4b, 4c, 4d, 4e are spatially superposed on one another (symbolized in FIG. 3 by the bracket) and may be received in the local coil interface 3 as a superposed RF transmit signal (or mixed RF transmit signal) using an antenna array 6. The superposed RF transmit signal is processed, (e.g., decoded once more), with an orbital angular momentum encoding unit 5 of the MR signal processing device 12.

Figure 5:
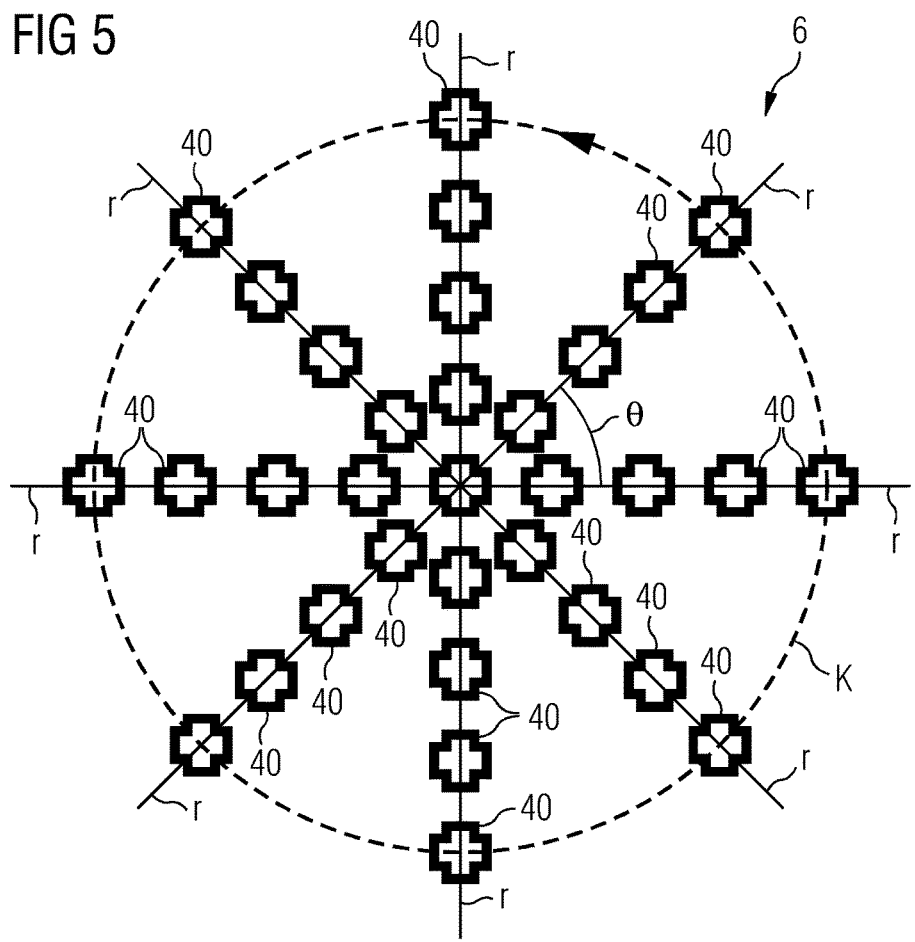
FIG. 5 depicts a schematic representation of a first embodiment of an antenna array.
Figure 8:
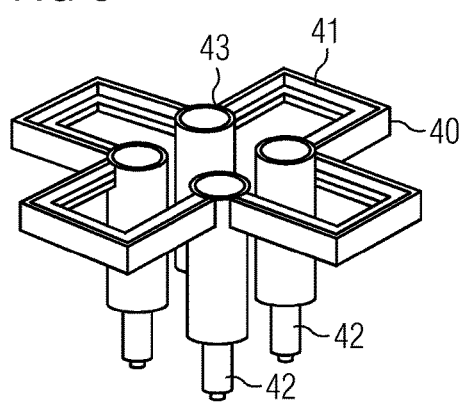
FIG. 8 depicts a detailed view of a turnstile antenna of the antenna array according to FIG. 5 or FIG. 7.

FIG. 5 depicts a first embodiment of an antenna array 6. In this antenna array 6, a total of 33 individual turnstile antennas 40 are disposed according to a polar coordinate grid. An example of a turnstile antenna of this type is depicted in FIG. 8. The turnstile antenna 40 has a structural form with a conductor 41 that runs in a conductor plane along the outer contours of a cross. The four connections 42 of the turnstile antennas 40 pass on the inner corners of the cross shape in each case perpendicular to the conductor plane. The direction and strength of the electrical field at the location of the antenna 40, e.g., the local field vector that may be used as a field value, as described below, to determine the angular momentum of the received RF transmit signal, may be measured with a turnstile antenna 40 of this type.

One of the turnstile antennas 40 is located in the center point of the antenna array 6, and four turnstile antennas 40 out of the other turnstile antennas 40 are arranged in each case at equal distances from one another on eight (imaginary) beams or "spokes" running radially outward, which in turn are disposed at equal angular distances from one another.

The antenna array 6 according to FIG. 5 enables the reception and decoding of individual RF transmit signals $HF_{-2}$, $HF_{-1}$, $HF_0$, $HF_{+1}$, $HF_{+2}$ with different orbital angular momenta, irrespective of whether they are measured separately in time or as a superposed or mixed RF transmit signal. To do this, antenna measurement values, (e.g., field values of the electrical field at the time concerned), are measured at different times t, in each case simultaneously at different angular positions θ of the antenna array 6. The signal value for the individual RF transmit signals at the respective time t may then be calculated on the basis of these antenna measurement values.

Figure 6:
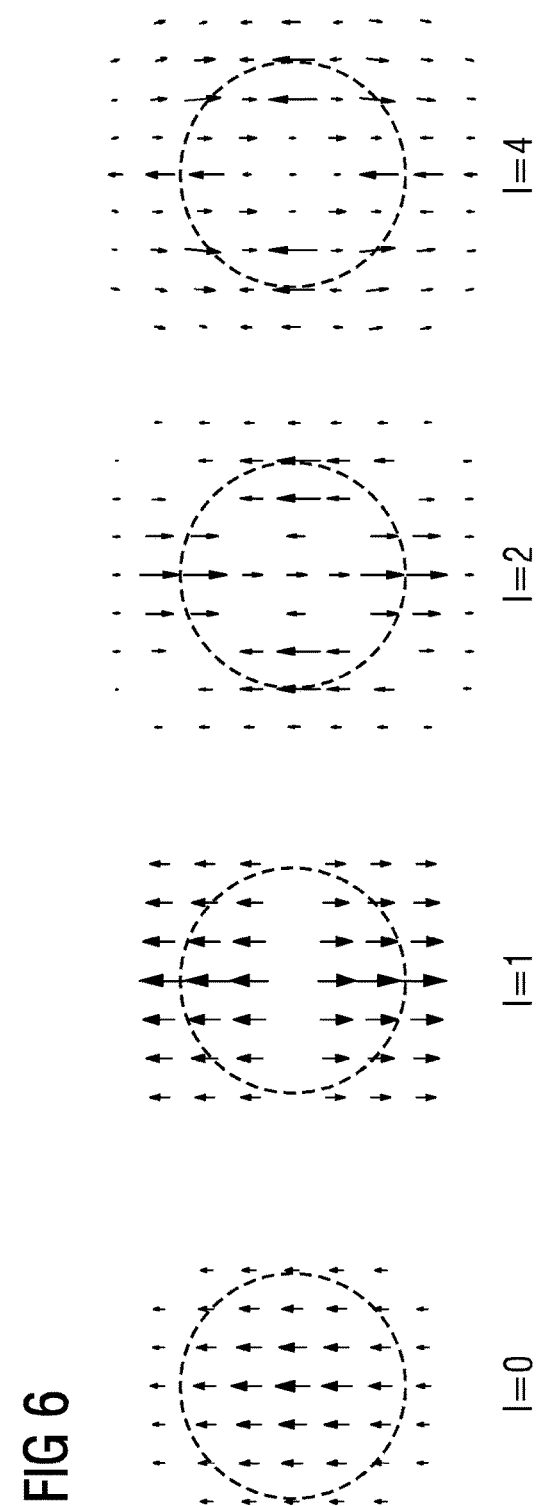
FIG. 6 depicts embodiments of an electrical field distribution perpendicular to the direction of propagation for different RF transmit signals having orbital angular momenta.

The principle underlying this procedure is explained with reference to FIG. 6. FIG. 6 depicts, from left to right, the different field distributions of the electrical field vectors of electromagnetic signals with the orbital angular momenta l=0, l=1, l=2, and l=4, in each case in a cross section selected perpendicular to the direction of propagation A. In each case, the strength of the electrical field vector is depicted locally by a vector arrow, where the arrow direction represents the local alignment of the electrical field vector and the length of the vector arrows represents the amount of the electrical field. These figures indicate how the relative local spatial alignment of the electrical field vector changes due to the angular momentum. In the field with the angular momentum l=0 (left image), the local field vector is located with a rotation along the circle drawn as a dotted line at a given time parallel at all locations (here, for example, upward). In the field with the angular momentum l=1 (second image from the left), the field direction changes with a rotation around the center point every 180°, in the field with the angular momentum l=2 (second image from the right) every 90°, and in the field with the angular momentum l=4 (right image) every 45°.

With a simultaneous measurement of the electrical field vector at different points with different angles (e.g., on a circular path around the center point or on a spiral-shaped path), as is possible, for example, with the antenna array 6 according to FIG. 5, the obtained field values in total also contain the information indicating the angular momentum that the received electromagnetic signal had.

For the further mathematical explanation of the procedure, the signal, (e.g., the electrical field vector E(θ,t)), which may be received along a circular path K, is depicted in the following formula as a function of the azimuthal angular positions θ.

The electrical field vector E(θ,t) varies with the time t, but, for the sake of simplicity, only values at an individual measurement time are considered below, and therefore only the symbol E(θ) is used below for the electrical field vector. This electrical field vector E(θ) of the superposed RF transmit signal measured by the antenna array 6 along a spoke r is given in dependence on the angular position θ by:

$$E(\theta) = E_0 + \sum_{l=1}^{\infty} E_l \sin(l \cdot \theta) \qquad (2)$$

Here, $E_0$ is the mean field strength of all field vectors E(θ) measured at the different angular positions θ:

$$E_0 = \underset{\theta}{\text{avg}}[E(\theta)] = \int_0^{2\pi} E(\theta)\, d\theta \qquad (3)$$

The field strength $E_1$ (e.g., for a time t) of the component of a RF transmit signal with the angular momentum l within the received mixed RF transmit signal may be determined from these values by a discrete Fourier transform or Fourier decomposition as follows:

$$E_l = \underset{\theta}{\text{avg}}[(E(\theta) - E_0)\sin(l \cdot \theta)] = \int_0^{2\pi}(E(\theta) - E_0)\sin(l \cdot \theta)\, d\theta \qquad (4)$$
$$= \int_0^{2\pi}\sum_{k=1}^{N} E_k \sin(k \cdot \theta)\sin(l \cdot \theta)\, d\theta$$

Equation (3) therefore corresponds to an integration, weighted with the weighting factor $e^{(-i/l)}$, of the complex field vector along a rotation (e.g., integration path) around the beam axis, e.g., the axis of the direction of propagation of the wave. Here, l represents the different angular momentum states, N is the maximum number of the various different angular momentum states l, and k is a control variable that similarly represents the different angular momentum states within the Fourier decomposition. The maximum number N of the different angular momentum states l of the RF transmit signal distinguishable or decodable by an antenna array of this type is in fact limited by the number M of antenna elements or possible different measurement points along a rotation around the beam axis according to N<M/2. An equation system is obtained by Equation (3) for each specific measurement at a time t, from which the target field vector $E_1$ of the RF transmit signal with the angular momentum state l may ultimately be calculated from the electrical field vectors $E(\theta)$ measured by the antenna array 6. Interestingly, it suffices in each case only to determine one value $E(\theta)$ for a sufficient number of angular positions θ (e.g., double the number of the maximum possible angular momentum states l). It may suffice to measure the signal of an antenna element along a spoke r. In this respect, it would also suffice to construct an antenna array that has only one circle of antenna elements. In the embodiment according to FIG. 5, all antenna elements located on a spoke r may advantageously be combined initially to form a common field vector $E(\theta)$, which is then incorporated into the above calculation. For example, a mean value of the measurement values along a spoke may be formed. This has the advantage that the signal is measured redundantly. The antenna element located in the center serves primarily to acquire RF transmit signals with the angular momentum l=0.

Figure 7:
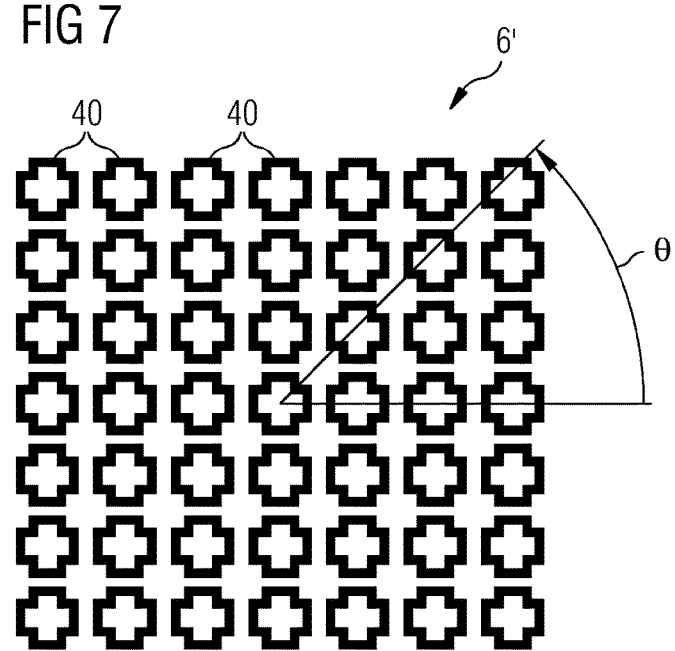
FIG. 7 depicts a schematic representation of a second embodiment of an antenna array.

A second example embodiment of an antenna array is depicted in FIG. 7. The antenna array 6 according to FIG. 7 includes 7×7 antenna elements 40 in an even grid in a Cartesian coordinate arrangement. Field values may also be determined herewith depending on the angle θ, e.g., on a circle around the center point of the antenna array 6 in order to receive and decrypt the RF transmit signals having an orbital angular momentum with the method described above (e.g., by Equations (1) to (3)). If necessary, (virtual) field values lying between the individual antenna elements 40 may also be interpolated here from the antenna measurement values measured on the antenna elements 40. The individual antenna elements 40 may again be designed here also as turnstile antennas 40, as depicted in FIG. 8.

The turnstile antennas 40 depicted in FIGS. 5, 7, and 8 have a compact structural form and may therefore be used if the antenna array may be aligned at least approximately perpendicular to the virtual propagation axis A of the electromagnetic wave to be received (see FIG. 1).

Figure 9:
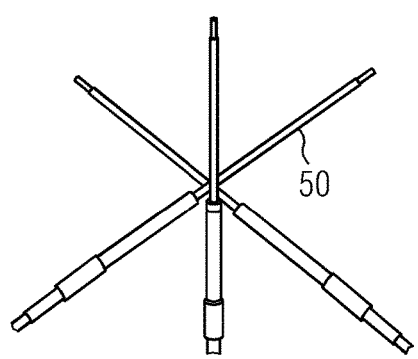
FIG. 9 depicts a detailed view of an embodiment of a tripole antenna for use in an antenna array analogous to FIG. 5 or FIG. 7.

Tripole antennas 50 may also be used in an antenna array 6 as an alternative to the turnstile antennas 40. FIG. 9 depicts a schematic representation of a possible tripole antenna 50. This involves a structural form in which six rod antennas may be used from the center point in the direction of the respective axes. Tripole antennas 50 may transmit and/or receive signals having an orbital angular momentum in any direction in relation to the propagation axis A.

Exclusively turnstile antennas 40 or exclusively tripole antennas 50, but also turnstile antennas 40 and tripole antennas 50 may be used in the antenna arrays 6.

Particularly with digital sampling units that are connected directly to each turnstile antenna 40 or tripole antenna 50, the local current two-dimensional or three-dimensional field vectors of the RF transmit signals may be measured coherently into the gigahertz range so that they may then be evaluated, for example with suitable software, in the manner described above.

Figure 10:
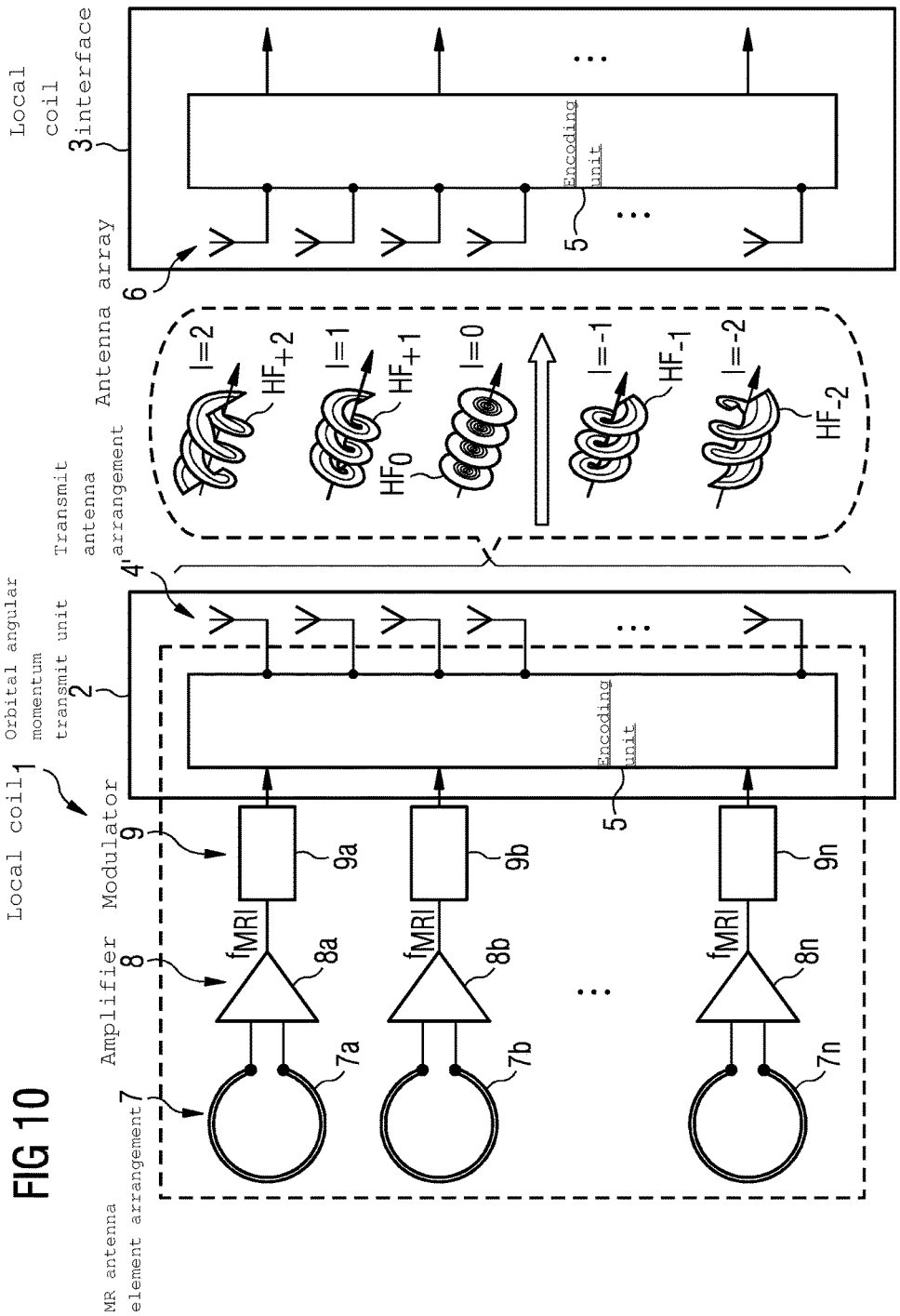
FIG. 10 depicts a schematic representation of a second embodiment of a local coil and a local coil interface.

FIG. 10 depicts a schematic representation of a second example embodiment of a local coil 1 and a local coil interface 3. This second embodiment differs from the first embodiment according to FIG. 3 in that the local coil transmit antenna arrangement 4' is designed as an antenna array 4' along the lines of the antenna array with directional antenna elements (e.g., the turnstile antennas or tripole antennas already illustrated), as depicted, for example, in FIG. 5 or FIG. 7. Using the antenna array 4', an individual RF transmit signal having an orbital angular momentum may be generated, e.g., a RF transmit signal with I=1. A superposed or mixed RF transmit signal may also be generated that includes a plurality of RF transmit signals $HF_{-2}$, $HF_{-1}$, $HF_0$, $HF_{+1}$, $HF_{+2}$ having an orbital angular momentum, so that an orbital angular momentum multiplexing may thus be achieved, as is also possible with the antenna arrangement 4 with the individual horn antennas 4a, 4b, . . . , 4e. The fact that the superposed RF transmit signal is transmitted here directly is symbolized in FIG. 10 by the bracket on the antenna arrangement 4' and the frames emanating therefrom, which includes the individual RF transmit signals $HF_{-2}$, $HF_{-1}$, $HF_0$, $HF_{+1}$, $HF_{+2}$. To do this, the orbital angular momentum encoding unit 5 is designed so that it calculates the field vectors $E(\theta)$ in each case for the individual antenna elements depending on the angular positions θ of the respective antenna element in order to generate in total a RF transmit signal with the orbital angular momentum I via the parallel transmission of the fields of the individual antenna elements at the relevant time. Equation (3) may again be used to calculate the electrical field vectors $E(\theta)$ required for the transmission of an electrical (e.g., complex) field vector $E_1$.

Otherwise, the arrangement according to FIG. 10 corresponds in terms of its structure and function to the arrangement depicted in FIG. 3. The use of horn antennas has proven to be particularly advantageous if a carrier frequency above 10 GHz is used, and an antenna array may be used below 10 GHz. The use of an antenna array furthermore has the advantage that it is well suited for both transmitting and receiving the RF transmit signals having an orbital angular momentum.

According to the example above, measurement signals $f_{MRI}$, for example, were transmitted from a local coil 1 to the local coil interface 3 on the control device 12 of the MR system 10. The local coil interface 3 may also transmit a RF transmit signal, (e.g., a control signal), to the local coil transmit antenna arrangement 4'. The local coil transmit antenna arrangement 4' receives this signal and via the signal, controls, for example, the particular antenna conductor loops 7a, 7b, . . . , 7n of the MR antenna element arrangement 7 that are to be activated.

It is again noted that the methods and transmit devices described in detail above are merely example embodiments that may be modified by the person skilled in the art in the widest variety of ways without deviating from the scope of the invention. For the sake of completeness, it is also noted that the use of the indefinite article "a" or "an" does not exclude the possibility that the features concerned may also be present in multiple form. Similarly, the term "unit" does not exclude the possibility that said unit may also include a plurality of components that may, where appropriate, also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for a wireless signal transmission of a measurement signal or a control signal between two functional components of a magnetic resonance (MR) system, the method comprising:
encoding, by an orbital angular momentum encoding unit of the MR system, the measurement signal, the control signal, or the measurement signal and the control signal into a radio-frequency (RFS transmit signal with a predefined orbital angular momentum rendering the RF transmit signal distinguishable from other RF signals within a same frequency range;
transmitting the RF transmit signal between transmit antenna arrangements of the two functional components of the MR system; and
decoding, by the orbital angular momentum encoding unit, the RF transmit signal.

2. The method as claimed in claim 1, wherein one of the two functional components comprises a local coil and a second of the two functional components comprises a local coil interface on a device site of the MR system, and wherein the measurement signal comprises a MR signal.

3. The method as claimed in claim 1, wherein RF transmit signals with different orbital angular momentum are superposed in a multiplex method.

4. The method as claimed in claim 1, wherein the RF transmit signal is in a frequency range above 1 GHz.

5. The method as claimed in claim 1, wherein the RF transmit signal is in a frequency range of 2 GHz with a frequency bandwidth of ±15 MHz.

6. The method as claimed in claim 1, wherein the RF transmit signal is generated by an antenna array.

7. The method as claimed in claim 6, wherein the antenna array comprises turnstile antennas, tripole antennas, or the turnstile antennas and the tripole antennas.

8. The method as claimed in claim 1, wherein the RF transmit signal is received and decoded by an antenna array.

9. The method as claimed in claim 8, wherein field values are measured for decoding RF transmit signals with different orbital angular momenta at different times at different angular positions of the antenna array, and a signal value of individual RF transmit signals at the respective time is calculated based on the field values.

10. The method as claimed in claim 1, wherein a Fourier transform is used to decode the RF transmit signal.

11. A method for a wireless signal transmission of a measurement signal or a control signal between two functional components of a magnetic resonance (MR) system, the method comprising:
encoding the measurement signal, the control signal, or the measurement signal and the control signal into a radio-frequency (RF) transmit signal with a predefined orbital angular momentum, wherein the orbital angular momentum is impressed on the RF transmit signal by a phase plate; and
transmitting the RF transmit signal between transmit antenna arrangements of the two functional components of the MR system.

12. A local coil comprising:
a magnetic resonance (MR) antenna arrangement; and
an orbital angular momentum transmit unit comprising:
a local coil transmit antenna arrangement configured to receive and transmit a radio-frequency (RF) signal having an orbital angular momentum;
an orbital angular momentum encoding unit configured to encode measurement signals and/or control signals onto a RF transmit signal rendering the RF transmit signal distinguishable from other RF signals within a same frequency range, and decode signals from the RF transmit signal.

13. An orbital angular momentum transmit unit comprising:
an antenna array for receiving and transmitting a radio-frequency (RF) transmit signal, wherein the antenna array is a polar coordinate grid; and
an orbital angular momentum encoding unit for encoding, decoding, or encoding and decoding the RF transmit signal.

14. The orbital angular momentum transmit unit as claimed in claim 13, wherein the orbital angular momentum encoding unit encodes, decodes, or encodes and decodes the RF transmit signal by a Fourier transform.

15. The orbital angular momentum transmit unit as claimed in claim 13, wherein the antenna array comprises turnstile antennas, tripole antennas, or the turnstile antennas and the tripole antennas.

16. A magnetic resonance (MR) system comprising:
a local coil comprising:
(1) a MR antenna arrangement; and
(2) an orbital angular momentum transmit unit comprising: (a) a local coil transmit antenna arrangement configured to receive and transmit a radio-frequency (RF) transmit signal having an orbital angular momentum; and (b) an orbital angular momentum encoding unit configured to encode measurement signals and/or control signals onto the RF transmit signal rendering the RF transmit signal distinguishable from other RF signals within a same frequency range, and decode signals from the RF transmit signal; and
an additional orbital angular momentum transmit unit comprising:
(1) a transmit antenna arrangement; and
(2) an orbital angular momentum encoding unit for encoding, decoding, or encoding and decoding the RF transmit signal.

17. The MR system as claimed in claim 16, wherein the transmit antenna arrangement of the local coil or the additional orbital angular momentum transmit unit comprises turnstile antennas, tripole antennas, or the turnstile antennas and the tripole antennas for receiving and transmitting the RF transmit signal,
wherein the turnstile antennas, the tripole antennas, or the turnstile antennas and the tripole antennas are arranged in an antenna array.

18. The MR system as claimed in claim 16, wherein the orbital angular momentum encoding unit of the orbital angular momentum transmit unit of the local coil or the additional orbital angular momentum transmit unit encodes, decodes, or encodes and decodes the RF transmit signal by a Fourier transform.

* * * * *

UNITED STATES PATENT AND TRADEMARK OFFICE
CERTIFICATE OF CORRECTION

PATENT NO. : 9,810,753 B2
APPLICATION NO. : 14/487282
DATED : November 7, 2017
INVENTOR(S) : Stefan Popescu Page 1 of 1

It is certified that error appears in the above-identified patent and that said Letters Patent is hereby corrected as shown below:

In the Claims

Column 13
Claim 1, Line 12, "(RFS" should be "(RF)"

Signed and Sealed this
Second Day of January, 2018

Joseph Matal
*Performing the Functions and Duties of the*
*Under Secretary of Commerce for Intellectual Property and*
*Director of the United States Patent and Trademark Office*